(12) United States Patent
Kowalski

(10) Patent No.: US 10,509,434 B1
(45) Date of Patent: Dec. 17, 2019

(54) OSCILLATOR PROFILING FOR TIME SYNCHRONIZATION

(71) Applicant: Amazon Technologies, Inc., Reno, NV (US)

(72) Inventor: Marcin Piotr Kowalski, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 180 days.

(21) Appl. No.: 15/277,489

(22) Filed: Sep. 27, 2016

(51) Int. Cl.
*G06F 1/12* (2006.01)
*G06F 1/20* (2006.01)
*H03B 5/32* (2006.01)

(52) U.S. Cl.
CPC ............... *G06F 1/12* (2013.01); *G06F 1/206* (2013.01); *H03B 5/32* (2013.01)

(58) Field of Classification Search
None
See application file for complete search history.

(56) References Cited

U.S. PATENT DOCUMENTS

| | | | | |
|---|---|---|---|---|
| 6,711,230 | B1* | 3/2004 | Nicholls | G04G 3/00 327/147 |
| 8,872,110 | B2* | 10/2014 | Stratmann | H04N 5/3651 250/338.1 |
| 2001/0020279 | A1* | 9/2001 | Alanara | G04G 3/02 713/500 |
| 2002/0173284 | A1* | 11/2002 | Forrester | H03J 1/0008 455/255 |
| 2003/0184399 | A1* | 10/2003 | Lanoue | H03L 1/022 331/176 |
| 2005/0103873 | A1 | 5/2005 | Cheng | |
| 2005/0138455 | A1* | 6/2005 | Loukianov | H04N 21/242 713/400 |
| 2005/0285645 | A1* | 12/2005 | Hall | H03K 23/52 327/165 |
| 2006/0267703 | A1* | 11/2006 | Wang | G01S 19/235 331/176 |
| 2009/0225743 | A1* | 9/2009 | Nicholls | H04J 3/0688 370/350 |
| 2010/0017139 | A1* | 1/2010 | Adams | G01V 1/22 702/14 |

(Continued)

*Primary Examiner* — Jaweed A Abbaszadeh
*Assistant Examiner* — Cheri L. Harrington
(74) *Attorney, Agent, or Firm* — Hogan Lovells US, LLP

(57) ABSTRACT

The amount of drift in an oscillator, as a function of temperature, can be profiled by adjusting the temperature and monitoring the corresponding change in frequency of the oscillator. Temperature sensors on a computing device can provide the temperature readings for the profiling, as well as readings during operation. A system clock on the computing device can be synchronized with a reliable external clock at a regular interval, such as every fifteen minutes. Between those synchronizations, the temperature values provided by the temperature sensors can be determined and the corresponding oscillator drift determined according to the oscillator profile. The drift value can be used to adjust the output of the system clock to account for variations that may become present between the synchronization times. Effects of factors such as voltage and humidity can also be profiled to provide a more accurate timing signal.

20 Claims, 9 Drawing Sheets

(56) References Cited

U.S. PATENT DOCUMENTS

| | | | | |
|---|---|---|---|---|
| 2010/0309934 A1* | 12/2010 | Umayabashi | ............ | H03L 7/06 370/509 |
| 2012/0013372 A1* | 1/2012 | Campbell | ............... | H03K 5/135 327/141 |
| 2012/0023262 A1* | 1/2012 | Berke | ...................... | G06F 1/12 709/248 |
| 2012/0030495 A1* | 2/2012 | Chandhoke | ............... | G06F 1/10 713/400 |
| 2012/0069871 A1* | 3/2012 | Bickerstaff | ........... | G01S 19/235 375/146 |
| 2012/0256668 A1* | 10/2012 | Vassilieff | ............ | B60C 23/0408 327/162 |
| 2013/0326088 A1* | 12/2013 | Uchida | ..................... | G06F 1/14 709/248 |
| 2014/0003199 A1* | 1/2014 | Dougan | .................. | G04G 7/00 368/46 |
| 2015/0025831 A1* | 1/2015 | Mourey | ................... | G01K 3/10 702/130 |
| 2015/0244513 A1* | 8/2015 | Hartman | .................. | H04J 3/06 370/350 |
| 2015/0287318 A1* | 10/2015 | Nair | ....................... | G08C 17/02 340/5.52 |
| 2015/0372681 A1* | 12/2015 | Melanson | ............... | H03L 1/028 331/1 R |
| 2016/0112182 A1* | 4/2016 | Karnes | ................. | H04J 3/0697 375/362 |
| 2017/0214516 A1* | 7/2017 | Rivaud | ................... | H04L 7/033 |
| 2017/0315581 A1* | 11/2017 | Mikhaylov | ............... | G06F 1/12 |
| 2018/0073933 A1* | 3/2018 | Keskin | ................... | G01K 1/026 |
| 2018/0329962 A1* | 11/2018 | Schrijen | .................. | G09C 1/00 |

* cited by examiner

OSCILLATOR PROFILING FOR TIME SYNCHRONIZATION

BACKGROUND

Computer networks continue to get faster, more complex, and more distributed. Accordingly, there is a need for precise synchronization across these networks. Due to the large number of machines, however, the use of high accuracy digital clocks can be cost prohibitive. Many computing devices rely on oscillators to function as a timing source using a technology such as the network time protocol (NTP) to periodically synchronize the oscillator to an external reference clock. The synchronization period can be relatively long, such as on the order of about fifteen minutes in some situations. The length of the synchronization period may be insufficient for implementations where the load can vary significantly over relatively short periods of time, resulting in large fluctuations in temperature and other such factors. These factors can influence the drift in the oscillators, such that the periodic synchronization may not result in the accuracy needed to avoid timing errors and other such issues.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Approaches described and suggested herein relate to time synchronization in an electronic environment. In particular, various embodiments determine the amount of drift in an oscillator in order to correct for oscillator drift encountered between synchronization actions. Variations in the drift of an oscillator, at least as a function of temperature or other operational state variables, can be determined during a profiling process. Varying load can be applied to different components in a computing device to, for example, increase the temperature and determine the corresponding oscillator drift. The oscillator profile can be stored for purposes of determining drift values at various device temperatures. In some embodiments the profile can be a function of multiple temperature sensor inputs, or determined using a temperature map or model for the computing device. A system clock on the computing device can be synchronized with a reliable external clock at a regular interval, such as every fifteen minutes. Between those synchronizations, the temperature values provided by one or more temperature sensors can be determined and the corresponding oscillator drift determined according to the oscillator profile. The determined drift value can be used to adjust the output of the system clock to account for variations that may become present between the synchronization times. Factors such as voltage and humidity can also be measured as well in order to provide for a more accurate timing signal.

Various other such functions can be used as well within the scope of the various embodiments as would be apparent to one of ordinary skill in the art in light of the teachings and suggestions contained herein.

Figure 1:
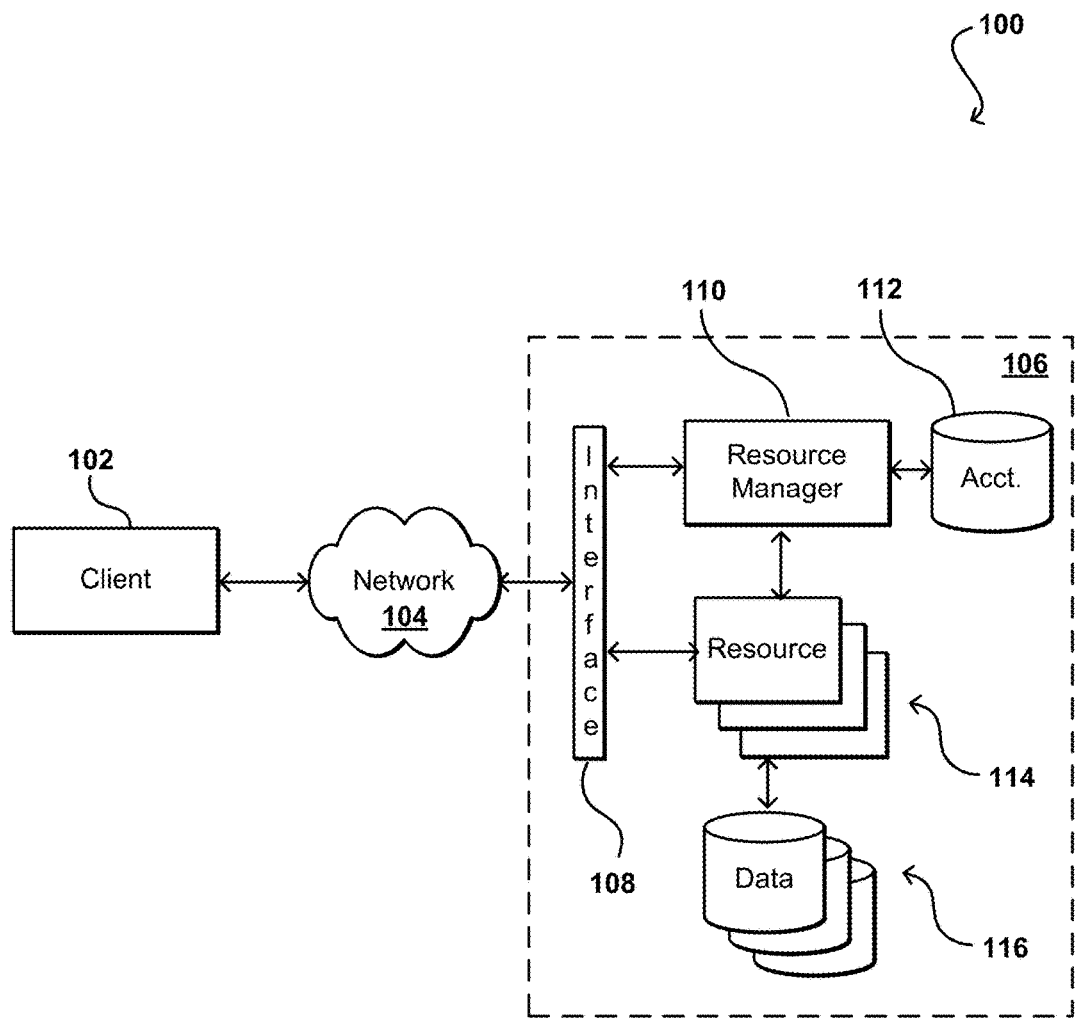
FIG. 1 illustrates an example environment in which various embodiments can be implemented.

FIG. 1 illustrates an example environment 100 in which aspects of the various embodiments can be implemented. In this example a user is able to utilize a client device 102 to submit requests across at least one network 104 to a resource provider environment 106. The client device can include any appropriate electronic device operable to send and receive requests, messages, or other such information over an appropriate network and convey information back to a user of the device. Examples of such client devices include personal computers, tablet computers, smart phones, notebook computers, and the like. The network 104 can include any appropriate network, including an intranet, the Internet, a cellular network, a local area network (LAN), or any other such network or combination, and communication over the network can be enabled via wired and/or wireless connections. The resource provider environment 106 can include any appropriate components for receiving requests and returning information or performing actions in response to those requests. As an example, the provider environment might include Web servers and/or application servers for receiving and processing requests, then returning data, Web pages, video, audio, or other such content or information in response to the request.

In various embodiments, the provider environment may include various types of electronic resources, physical or virtual, that can be utilized by multiple users for a variety of different purposes. As mentioned elsewhere herein, types of resources can include physical host servers, virtual machines, containers, functions, and the like. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example the provider environment includes a plurality of electronic resources 114 of one or more types. These types can include, for example, application servers operable to process instructions provided by a user or database servers operable to process data stored in one or more data stores 116 in response to a user request. As known for such purposes, the user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 114 can submit a request that is received to an interface layer 108 of the provider environment 106. The interface layer can include application programming interfaces (APIs) or other exposed interfaces enabling a user to submit requests to the provider environment. The interface layer 108 in this example can also include other components as well, such as at least one Web server, routing components, load balancers, and the like. When a request to provision a resource is received to the interface layer 108, information for the request can be directed to a resource manager 110 or other such system, service, or component configured to manage user accounts and information, resource provisioning and usage, and other such aspects. A resource manager 110 receiving the request can perform tasks such as to authenticate an identity of the user submitting the request, as well as to determine whether that user has an existing account with the resource provider, where the account data may be stored in at least one data store 112 in the provider environment. A user can provide any of various types of credentials in order to authenticate an identity of the user to the provider. These credentials can include, for example, a username and password pair, biometric data, a digital signature, or other such information.

The resource provider can validate this information against information stored for the user. If the user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The user can receive a resource identifier, specific address, or other such information that can enable the client device 102 to communicate with an allocated resource without having to communicate with the resource manager 110, at least until such time as a relevant aspect of the user account changes, the user is no longer granted access to the resource, or another such aspect changes.

The resource manager 110 (or another such system or service) in this example can also function as a virtual layer of hardware and software components that handles control functions in addition to management actions, as may include provisioning, scaling, replication, etc. The resource manager can utilize dedicated APIs in the interface layer 108, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer 108 in at least one embodiment includes a scalable set of customer-facing servers that can provide the various APIs and return the appropriate responses based on the API specifications. The interface layer also can include at least one API service layer that in one embodiment consists of stateless, replicated servers which process the externally-facing customer APIs. The interface layer can be responsible for Web service front end features such as authenticating customers based on credentials, authorizing the customer, throttling customer requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, customers of the control service. The servers of the Web services layer can be stateless and scaled horizontally as known in the art. API servers, as well as the persistent data store, can be spread across multiple data centers in a region, for example, such that the servers are resilient to single data center failures.

Figure 2:
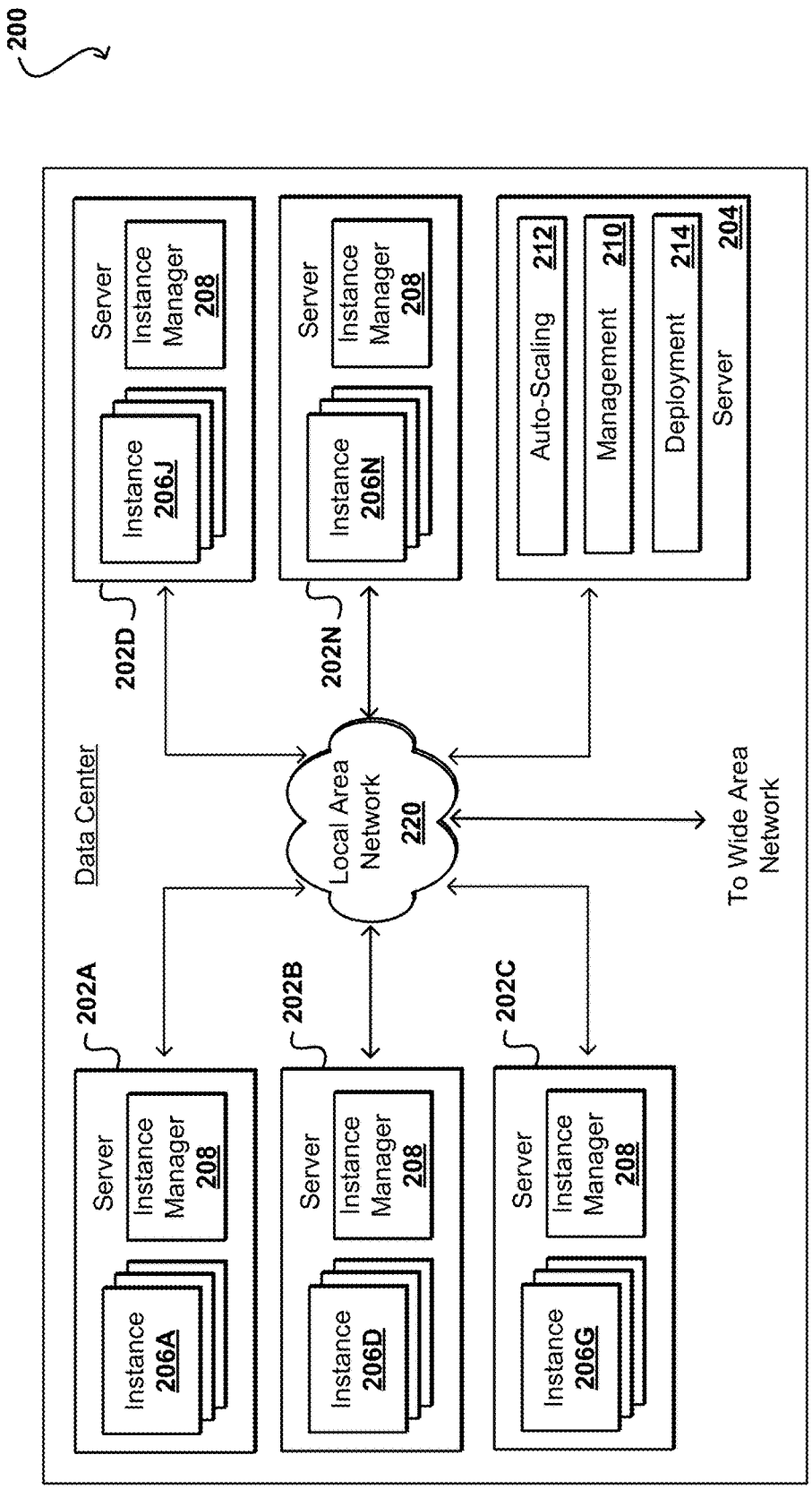
FIG. 2 illustrates an example data center in which various embodiments can be implemented.

FIG. 2 is a system diagram illustrating an example data center 200 that can be implemented using a resource provider environment such as the one described with respect to FIG. 1, and which can take advantage of timing approaches presented herein with respect to the various embodiments. The example data center 202 includes several server computers 202A-202N (which may be referred herein singularly as "a server computer 202" or in the plural as "the server computers 202") for providing computing resources for executing an application. The server computers 202 may be standard server computers configured appropriately for providing the computing resources described above. For instance, in one implementation the server computers 202 are configured to provide instances 206A-206N of computing resources.

In one embodiment, the instances 206A-206N (which may be referred to herein singularly as "an instance 206" or in the plural as "the instances 206") are virtual machine instances. As known in the art, a virtual machine instance is an instance of a software implementation of a machine (i.e. a computer) that executes programs like a physical machine. In the example of virtual machine instances, each of the servers 202 may be configured to execute an instance manager 208 capable of executing the instances. The instance manager 208 might be a hypervisor or another type of program configured to enable the execution of multiple instances 206 on a single server 202, for example. As discussed above, each of the instances 206 may be configured to execute all or a portion of an application.

It should be appreciated that although the embodiments disclosed herein are described primarily in the context of virtual machine instances, other types of instances can be utilized with the concepts and technologies disclosed herein. For instance, the technologies disclosed herein might be utilized with instances of storage resources, instances of data communications resources, and with other types of resources. The embodiments disclosed herein might also execute all or a portion of an application directly on a computer system without utilizing virtual machine instances.

The data center 202 illustrated in FIG. 2 also includes a server computer 204 reserved for executing software components for managing the operation of the data center 202, the server computers 202, and the instances 206. In particular, the server computer 204 might execute a management component 210. A customer might utilize the customer computing system to access the management component 210 to configure various aspects of the instances 206 allocated to the customer. For example, the customer may purchase instances and make changes to the configuration of the instances. The customer might also specify settings regarding how the instances are to be scaled in response to demand.

An auto scaling component 212 can scale the instances 206 based upon, for example, rules defined by a customer associated with those instances. In one embodiment, the auto scaling component 212 allows a customer to specify scale up rules for use in determining when new instances should be instantiated and scale down rules for use in determining when existing instances should be terminated.

The auto scaling component 212 may execute on a single server computer 204 or in parallel across multiple server computers 202. In addition, the auto scaling component 212 may consist of a number of subcomponents executing on different server computers 202 or other computing devices. The auto scaling component 212 may be implemented as software, hardware, or any combination of the two. The auto scaling component 212 may monitor available computing resources over an internal management network, for example. The auto scaling component 212 might also be utilized to scale and de-scale instances during the deployment of an update to an application.

The example data center 202 can also be configured with a deployment component 214 to assist customers in the deployment of new instances 206 of computing resources. The deployment component 214 may receive a configuration from a customer that includes data describing how new instances 206 should be configured. For example, the configuration might specify one or more applications that should be installed in new instances 206, provide scripts and/or other types of code to be executed for configuring new instances 206, provide cache warming logic specifying how an application cache should be prepared, and other types of information.

The deployment component 214 utilizes the customer-provided configuration and cache warming logic to launch, configure, and prime new instances 206. The configuration, cache warming logic, and other information may be specified by a customer using the management component 210 or by providing this information directly to the deployment component 214. Other mechanisms might also be utilized to configure the operation of the deployment component 214.

The deployment component 214 also provides functionality for deploying updates to an application. In this regard, the management component 210 might be configured to allow a customer to declare that one or more updates are available for an application and to provide update preferences indicating various factors regarding when and how the update should be performed. The deployment component 214 can utilize the update preferences to optimize the deployment of the updates to the instances in view of the various factors specified by the customer.

In the example data center 200 illustrated in FIG. 2, an appropriate LAN 220 is utilized to interconnect the server computers 202A-202N and the server computer 204. The LAN 220 is also connected to the WAN 106 illustrated in FIG. 1. It should be appreciated that the network topology illustrated in FIGS. 1 and 2 has been greatly simplified and that many more networks and networking devices may be utilized to interconnect the various computing systems disclosed herein. Appropriate load balancing devices or software modules might also be utilized for balancing a load between each of the data centers, between each of the server computers 202A-202N in each data center, and between instances 206 purchased by each customer, among other such options. These network topologies and devices should be apparent to those skilled in the art.

It should be appreciated that the example data center 200 described with respect to FIG. 2 is merely illustrative and that other implementations might be utilized. In particular, functionality described herein as being performed by the management component 210, the auto scaling component 212, and the deployment component 214 might be performed by other components or by a combination of these or other components. Additionally, it should be appreciated that this functionality might be implemented in software, hardware, or a combination of software and hardware. Other implementations should be apparent to those skilled in the art. Further, there are various other uses and implementations of resources, both physical and virtual, in a resource provider environment, multi-tenant environment, or other shared resource environment such as that described with respect to FIG. 1 that can take advantage of aspects of the various embodiments as discussed and suggested herein.

Figure 3:
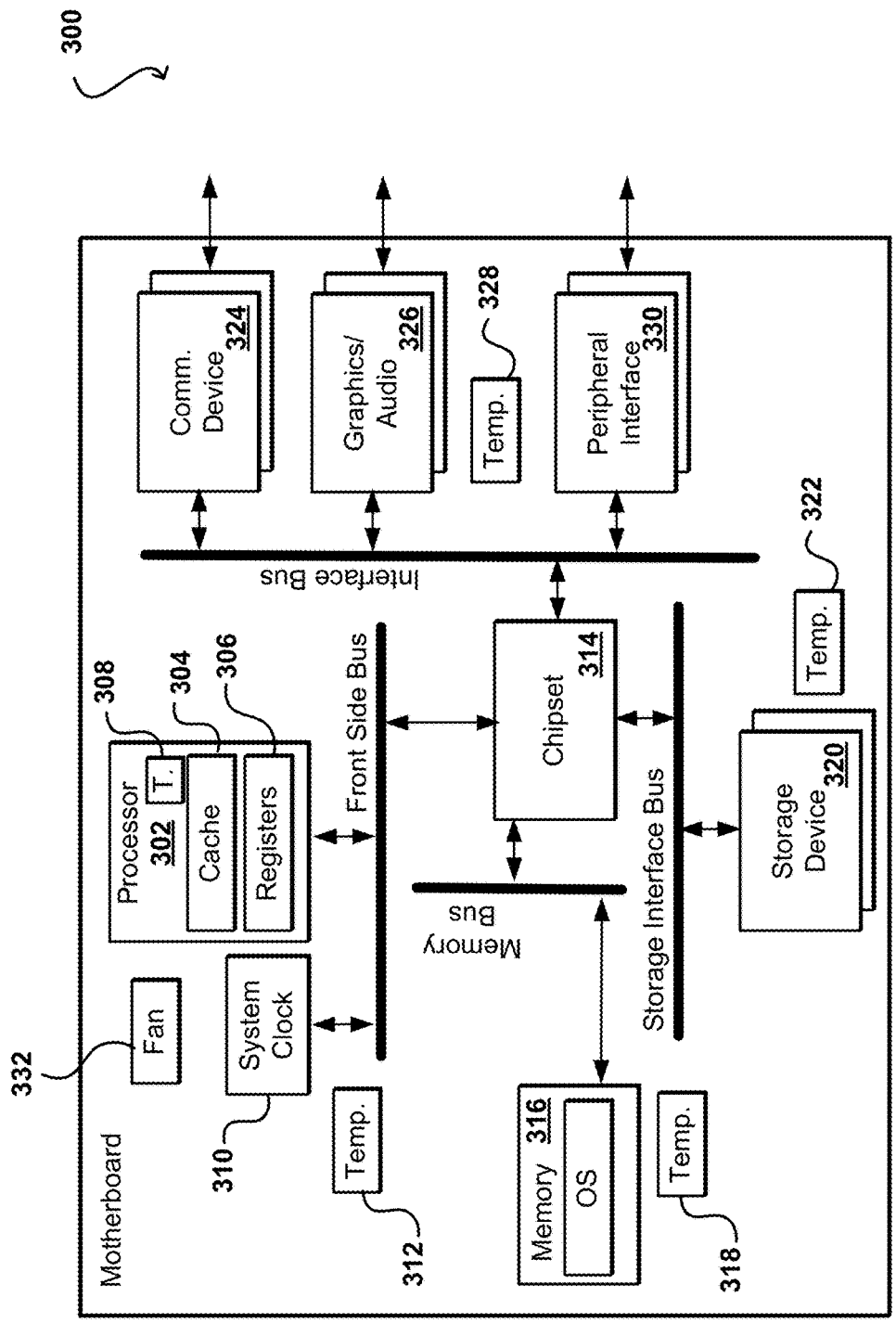
FIG. 3 illustrates components of an example computing device that can be utilized in accordance with various embodiments.

The computing resources, such as servers, in such an environment will generally include at least a set of standard components configured for general purpose operation, although various proprietary components and configurations can be used as well within the scope of the various embodiments. FIG. 3 illustrates components of an example computing device 300 that can be utilized in accordance with various embodiments. As known for computing devices, the computer will have one or more processors 302, such as central processing units (CPUs), graphics processors, and the like, that are electronically and/or communicatively coupled with various components using various buses, traces, and other such mechanisms. A processor 302 can include memory registers 306 and cache memory 304 for holding instructions, data, and the like. In this example, a chipset 314, which can include a northbridge and southbridge in some embodiments, can work with the various system buses to connect the processor 302 to components such as system memory 316, in the form or physical RAM or ROM, which can include the code for the operating system as well as various other instructions and data utilized for operation of the computing device. The computing device can also contain, or communicate with, one or more storage devices 320, such as hard drives, flash drives, optical storage, and the like, for persisting data and instructions similar, or in addition to, those stored in the processor and memory. The processor 302 can also communicate with various other components via the chipset 314 and an interface bus (or graphics bus, etc.), where those components can include communications devices 324 such as cellular modems or network cards, media components 326, such as graphics cards and audio components, and peripheral interfaces 330 for connecting peripheral devices, such as printers, keyboards, and the like. At least one cooling fan 332 or other such temperature regulating or reduction component can also be included as well, which can be driven by the processor or triggered by various other sensors or components on, or remote from, the device. Various other or alternative components and configurations can be utilized as well as known in the art for computing devices.

In this example computing device 300, there are a number of temperature sensors positioned at various locations across the motherboard. There can be temperature sensors positioned at other locations as well, such as may be attached to a server housing, power source, cooling system, etc. In this example, the processor 302 includes a temperature sensor 308 for monitoring the temperature of the processor, which can vary widely with load. Overheating can damage a processor, such that it can be important in at least some embodiments to frequently monitor or sample the processor temperature.

There can be temperature sensors positioned at various other locations as well. It can be desired to ensure that the overall heat level in the computing device does not exceed a certain temperature in order to avoid damaging of the components of the computing device. Further, as mentioned herein it can be desirable to determine the temperature of a computing device at one or more locations in order to determine how temperature changes affect the operation of one or more components of the computing device. As mentioned, the operation of oscillators can vary with changes in temperature, such that it can be desirable to determine the temperature at or near the oscillator. Thus, in this embodiment there is a temperature sensor 312 located near the system clock 310 which contains an oscillator that provides timing information for the processor 302. The proximity of the sensor to the oscillator can vary between devices, and the temperature across the clock can vary, such that it can be desirable in at least some embodiments to utilize the temperature values from the nearby temperature sensor 312 and the processor temperature sensor 308 to attempt to determine the actual temperature at the system clock 310. This can become more important as the distances between the temperature sensors and the clock increase, as well as with the proximity of other heat-generating components. It therefore can be desirable in at least some embodiments to utilize additional temperature sensors as well, particularly near components that generate heat under operation or load. This can include, for example, a temperature sensor 318 near system memory 316, a temperature sensor 322 near one or more storage devices 320, and a temperature sensor 328 near the graphics cards or other media or communications components 326, among other such options. The number and location of the temperature sensors can vary among devices and implementations, based upon factors such as the number and arrangement of components, variations in temperature across the device and at different levels of load, the accuracy of temperature determinations desired, and the like. In some sensors temperature sensors can be positioned around or on various components of a motherboard. In some embodiments an analog to digital (A/D) converter can be used to convert the temperature reading from a temperature sensor to a respective temperature value (i.e., converting a sensor output value to a number of degrees Fahrenheit).

As mentioned, conventional temperature sensors are used to detect when a computing device is approaching a specified temperature level, such as an overheating threshold, whereby the load on the device can be adjusted or other changes made to attempt to reduce the temperature of the device to avoid damaging any of the components contained therein. As discussed elsewhere herein, however, the values from these sensors can also be used to determine variations in operation of these components with changes in temperature, then attempt to determine a current operational state of those components with respect to a current determined and/or predicted temperature.

Figure 4:
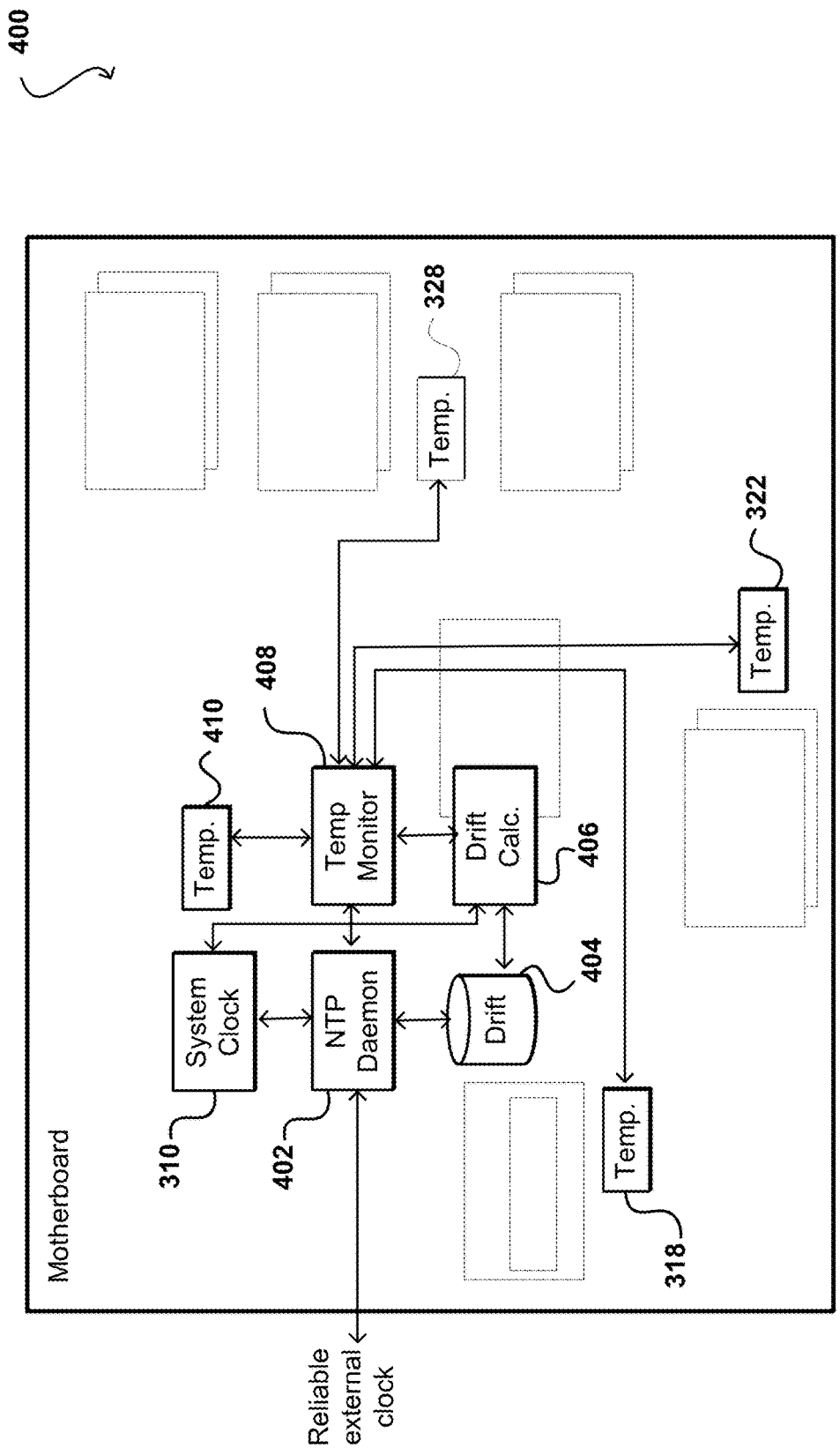
FIG. 4 illustrates components of drift management system that can be utilized in accordance with various embodiments.

FIG. 4 illustrates an example configuration 400 of components that can be utilized for temperature determinations, management, and other such operations within the scope of the various embodiments. The components are shown attached to the motherboard of FIG. 3, along with various other components shown in partial view, in order to illustrate that the temperature system components can be integrated with the components on the computing device. The temperature components can communicate using any of the various buses or communication lines mentioned with respect to FIG. 3, as appropriate, or can utilize separate traces or communication paths as illustrated in the example configuration 400 of FIG. 4.

In this example, a temperature monitor 408 is in communication with various temperature sensors 318 322, 328, 410 located at various locations across the computing device. It should be noted that reference numbers will be carried over between figures for similar components for simplicity of explanation, but such usage should not be interpreted as a limitation on the scope of the various embodiments unless otherwise specifically stated. The temperature monitor 408 can be responsible for gathering temperature information from the various sensors and keeping track of which temperature sensor provided each reading. In some embodiments the temperature monitor 408, or another such component, can store configuration information that indicates the relative locations of the various temperature sensors for which temperature data is obtained by the temperature monitor 408, as well as the locations of nearby heat-generating components in at least some embodiments. In other embodiments the locations of the various components may not matter, as the effect of various combinations of readings on one or more components can be determined and modeled without such information.

As mentioned, one of the components of a computing device that varies in operation with temperature is an oscillator used as a timing source, here part of the system clock 310. The oscillator can be a crystal oscillator of piezoelectric material, for example, that utilizes the mechanical resonance to provide an signal with a determined frequency. This frequency can be used as a reference for the timing of a computing device. As mentioned, a component or service such as an NTP daemon 402 (or PTP process, etc.) can be used to communicate with a reliable external clock and provide the accurate timing information to the system clock. An NTP daemon can ensure that the system time is synchronized with the external clock source using the network time protocol (NTP) or another TCP/IP or network-based protocol. The daemon 402 can contact the reference clock periodically, such as every ten or fifteen minutes, although other periods can be used as well within the scope of the various embodiments. Because there can be some drift in the system, as may be due to an imperfect oscillator, oscillator drift, or other such occurrences, the periodic synchronization is used to ensure that the timing is relatively accurate and does not deviate by more than an allowable amount.

As mentioned, however, the demands for timing accuracy are increasing, particularly with respect to large distributed systems where the data from a large number of devices must be combined while maintaining the order of operations. Significant drift in the timing of any of these devices can impact the data and operation of any of the related components. While it would be possible to check the external clock more often to improve accuracy, this is not practical for very large numbers of resources where it is desired to reduce cost where possible.

Accordingly, approaches in accordance with the various embodiments can attempt to determine the temperature at, or near, an oscillator in a computing device in order to determine a current rate of drift of the oscillator. The amount and/or rate of drift can be used to calculate the current time using the information from the oscillator and the last synchronized time reading. The variations can also be used to predict drift with temperature over a future period of time, in order to provide more accurate results. For example, a crystal might continue to drift for a period of time even if a temperature rapidly drops, without having an instantaneous adjustment, such that it can be desired to model the behavior of the crystal and determine the expected drift based on current, projected, and/or past variations in temperature. Because the temperature and response can vary with the operation of various components across the computing device, is can also be desirable in at least some embodiments to model the variations in heat across the computing device. The modeling of temperature variation can also be used to more accurately estimate the temperature at the oscillator for devices where a temperature sensor is not located on, or in, the oscillator component. Further, the modeling can help to predict how temperature is likely to change for such a sensor over a future period of time.

In the example configuration 400 of FIG. 4, a drift calculator 406 is provided for the computing device that is able to communicate with the temperature monitor 408. The drift calculator and temperature monitor can each be implemented in hardware and/or software in various embodiments. During a testing or modeling phase, the drift calculator 406 can obtain temperature information from the temperature monitor 408 as well as clock data from the system clock 310, including the oscillator to be modeled, in order to determine the drift of the oscillator with temperature. This drift profile data can then be stored to a drift data store 404, or other such repository, of the computing system. In this example the NTP daemon 402 can be configured to access the drift profile data in the drift data store 404 as well as the current temperature from the temperature monitor 408 or drift calculator 406, in order to provide updated timing information to the system clock. In this example, the NTP daemon can continually update the timing information using the calculated drift values based on temperature, then periodically synchronize the system clock with the reliable external clock to account for any remaining variation. The calculated drift should be accurate enough to enable the system clock to remain synchronized to within hundreds of microseconds in some embodiments, without utilizing a more expensive oscillator or requiring frequency communications with the external clock. The NTP daemon 402 and/or drift calculator 406 can also determine the extent by which the timing was off for an external clock synchronization to determine whether the oscillator is changing in behavior, requiring another or updated modeling, or whether the behavior of the crystal has become erratic or chaotic, in which case one or more components of the computing device, or the device itself, may need to be replaced. In some embodiments a baseboard management controller (BMC) can be used to sample the temperature readout and measure the drift rare relative to the disciplined source, as well as to perform other functions discussed herein.

Figure 5:
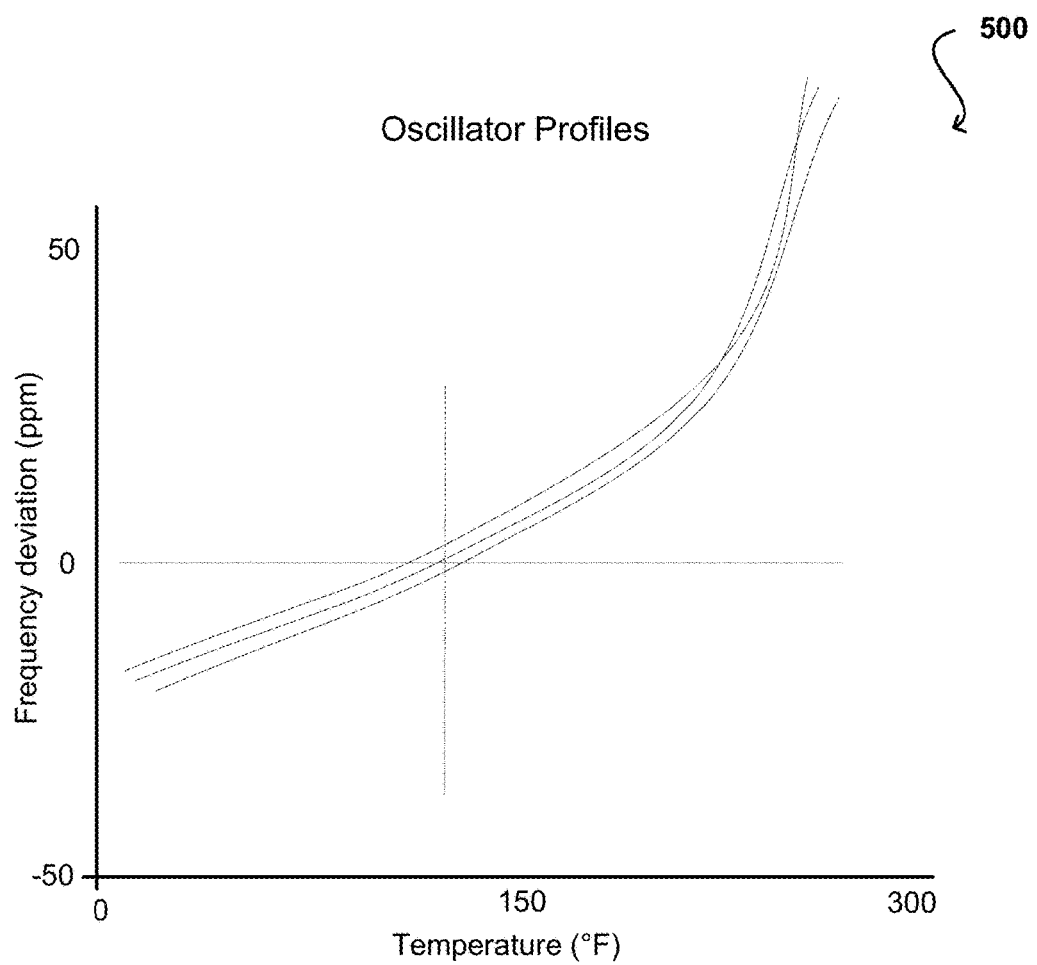
FIG. 5 illustrates example oscillator profiles components that can be generated in accordance with various embodiments.

As mentioned, the frequency with which an oscillator oscillates, or vibrates, can vary or "drift" with temperature. The graph 500 of FIG. 5 illustrates the example profiles of a set of oscillators that can be determined in accordance with various embodiments. In this example, the temperature of the computing device is varied over time during a profiling stage, and the variation or deviation in frequency can be modeled as a function of temperature. As illustrated in the graph 500, the profiles for different oscillators may be similar but different enough that it can be desirable to model each particular oscillator, at least for certain types of oscillator and depending upon the accuracy required. Further, the performance of a crystal can change over time such that the profile for an individual oscillator can vary as well. By determining the profile of an oscillator, the amount of drift per unit time can be determined, and this drift amount can be used to account for variations in the performance of the oscillator between external clock synchronizations. It should be noted that the zero point for frequency variation in the graph can depend upon the reference frame for the oscillator, which can be based upon ambient room temperature, as in the graph, or from absolute zero, among other such options.

In order to determine such a profile, it can be desirable to profile the oscillator in the computing device during operation. Thus, as part of an initialization or startup procedure, such as may execute when a server is first added to a rack or data center, load can be added to one or more components over time in order to adjust the temperature over the desired range. Similarly, the load on one or more temperature reduction components, such as cooling fans, can be adjusted to increase the temperature as well. In order to not have the temperature rise too quickly, which might result in less accurate profiling over intermediate temperatures, load can be applied to various components sequentially in order to more slowly adjust the temperature. The variations in temperature can be modeled in order to determine a pacing and order of the application of load to various components for a specific computing device configuration. For example, in one embodiment an amount of load might be applied to a processor until the processor has a full load, then load may be applied to memory, then to a graphics card, etc., until the range of temperature values has been sampled at an appropriate rate of change. In some embodiments the loads may be adjusted in parallel, and other load adjustments determined or utilized as well in order to make a relatively smooth adjustment. Adjustments to the cooling elements might be adjusted as a final step of the process, as reducing the amount of heat removal under a full load can drastically increase the temperature in at least some embodiments. The adjusting of the heat reduction elements can also help to simulate the impact of temperature variations in a data center or other environment about the computing device.

The drift can be sampled at the various temperature values, and the rate of sampling and rate of temperature change can vary depending upon factors such as the type of oscillator and rate at which temperature may vary in the computing device under customer workload, etc. The values can then be stored in a lookup table or a function or curve fit to the data, among other such options. For any time during operation, the NTP daemon or other appropriate component can obtain the calculated temperature at the oscillator and perform a lookup to determine the current amount of drift. This can then be applied to the system clock in order to adjust for the drift in the oscillator signal. For example, if it is determined that due to drift the oscillator would have caused the system clock to fall behind by ten microseconds since the last reading, then the system clock can be adjusted forward by ten microseconds (or slightly more if trying to make more accurate over the next period) in order to increase the accuracy of the system clock.

Figure 6:
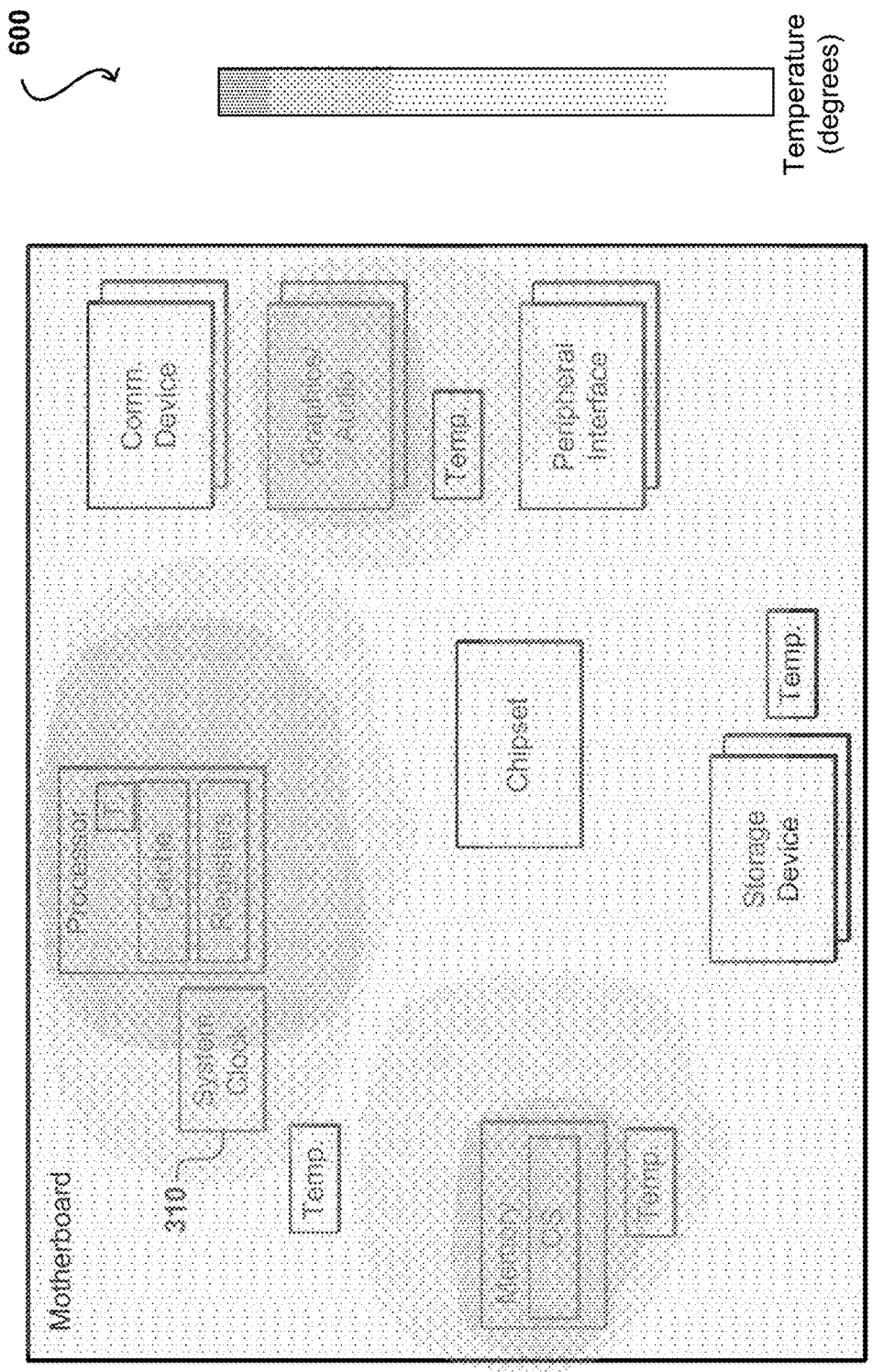
FIG. 6 illustrates an example heat map that can be generated for a computing device in accordance with various embodiments.

As mentioned, different components across the computing device can contribute to variations in temperature in different ways. Since in many systems there will not be a temperature sensor right at the oscillator, it can be desirable to model the temperature variations across the device in order to better estimate the temperature at the location of the oscillator. The changes in temperature under different component loads can also be mapped and modeled in order to provide better predictions of temperature over future periods of time. One approach for modeling variation involves generating a heat map 600 as illustrated in FIG. 6. Here the temperature under specified loads on certain components is mapped, which enables a determination of the temperature at the location of the system clock 310. This map can be modeled so that for any loads applied to the measured components a current heat map can be generated and the temperature at the system clock determined. This can be generated similar to the oscillator profiling process discussed previously, where load is applied to different components over time in order to determine changes in temperature which can then be used to model the performance of the computing device. The heat map can then be ingested by the NTP daemon in some embodiments for purposes of determining oscillator response for a current set of temperature readings. In some embodiments, the heat map data (as well as related performance and profiling data) can be provided to an external entity, such as a hardware manufacturer or designer, for purposes of improving the placement of various components or control of temperature variations in a device. Such information can also help to provide recommendations as to the placement of various components, including the oscillator, temperature sensors, fans, and other such components. Future board designs can be based at least in part upon the information provided from such mappings. The mapping of variations can also be provided to persons responsible for selecting the types of computing devices to be purchased and implemented, etc. In at least some embodiments the performance, heat map, and other such data can be stored to a central or remote location, such as a central repository in a data center, for analysis.

It should be noted, however, that such accuracy in heat determination may not be necessary in all embodiments. In some embodiments the values of the temperature sensors will be modeled as inputs with respect to drift without any knowledge or information about their location in the device. In some embodiments an average temperature will be used to determine the expected drift. In still other embodiments the values of the temperature sensors may be weighted based on proximity to the oscillator or impact on overall temperature fluctuations, among other such options. In this example an exponential curve was fit to the data, while in other embodiments linear fits may be sufficient or the data may be used without curve fitting, among other such options. In some embodiments the profiling can iterate through various combinations of heat producing elements, heat reduction elements, and temperature sensors to determine, for example, the sensitivity of the oscillator to determine whether a single or averaged temperature value is sufficient or whether mapping of the temperature variations is required. Similarly, such an approach can help to identify temperature sensors with irregular or unreliable temperature readings, for example, that should be excluded from the temperature determinations. Further, the readings from one or two temperature sensors may be sufficient to make the determination, with the values from other sensors being duplicative or otherwise having little effect on the accuracy of the determinations, such that only the values from specific sensors may be utilized. Various other optimizations can be utilized as well within the scope of the various embodiments.

Figure 7:
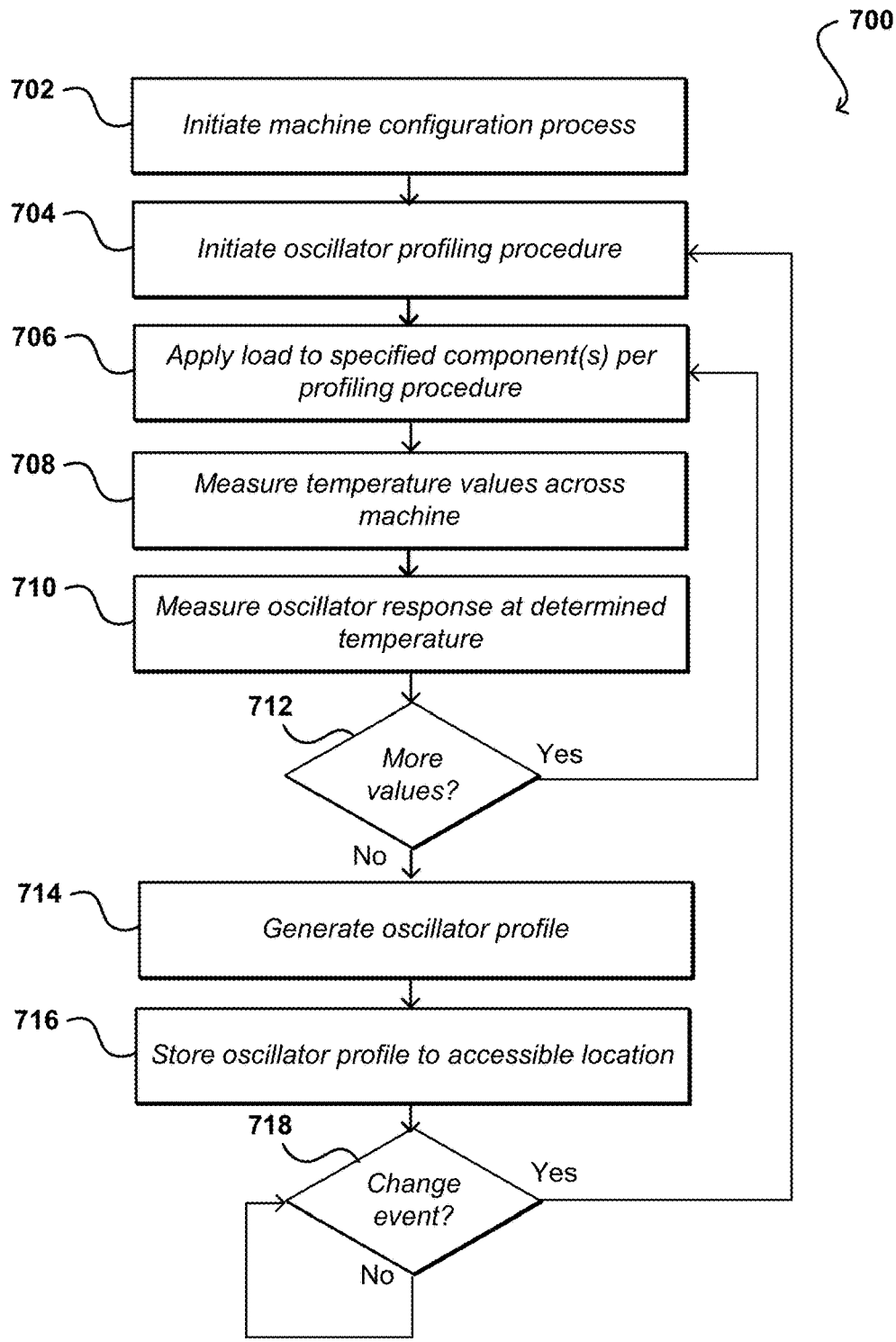
FIG. 7 illustrates an example process for profiling an oscillator implemented in a computing device that can be utilized in accordance with various embodiments.

FIG. 7 illustrates one example process 700 for profiling an oscillator that can be utilized in accordance with various embodiments. In this example, a machine configuration process is initiated 702, such as may be in response to a new server being placed in a server rack in a data center or otherwise being brought online. This process can occur automatically or in response to an administrator command, among other such options. As part of the configuration or startup, an oscillator profiling procedure can be initiated 704. This can be directed from the device or from a configuration service in communication with the server, among other such options. Per a profiling procedure, load can be applied 706 to specified components with a particular sequence, rate, or order, which may vary by type or configuration. This can involve, for example, applying a load to a processor, then to memory along with the processor load, then adding load to a graphics card, and so on. As mentioned this can also involve adjusting operation of heat-reduction components, such as to reduce the operating speed of a cooling fan or other such element. The load can be applied in a pre-determined way at a predetermined rate, or can depend at least in part upon the measured temperature in the device, among other such options. The temperature values across the machine can be measured 708 using the appropriate temperature sensors. The readings can be taken and/or analyzed at any appropriate frequency or other such timing. At the same or similar times, the oscillator response can be measured 710 and associated with the determined temperature value. As mentioned, this can be associated with a specific value, an average value, a value from a heat map, a value for a calculated temperature, a value associated with all detected temperatures, or other such options. A determination can be made 712 as to whether there are additional temperature values for which oscillator response should be modeled. The values can be predetermined or there can be a specified maximum temperature value or oscillator variation, among other such options. Once the appropriate data has been gathered, an oscillator profile can be generated 714 either on the device itself or using an external system or service. This profile data can then be stored 716 to an accessible location in the data center control plane or management service, as well as to the device itself in at least some embodiments. In this example, the state of the device can be monitored to determine whether any change events occur. A change event can be an operation such as a reconfiguration or rebuilding of a computing device, which may require a re-profiling, or an amount of drift in the oscillator timing signal that exceeds an allowable variation threshold, among other such options discussed and suggested herein. If it is determined 718 that a change event has occurred, then another oscillator profiling procedure can be initiated 704 to re-profile the oscillator. As mentioned, if the oscillator begins performing erratically then a determination might be made to replace the motherboard or device, among other such options. If the device is to be replaced or rebuilt, and the device is serving customers in a data center or multi-tenant environment, then it may also be necessary to relocate data, customer instances, or other such objects to other machines, in order to be able to perform the necessary work and then profile, or re-profile, the oscillator before making the device again available for such use.

Figure 8:
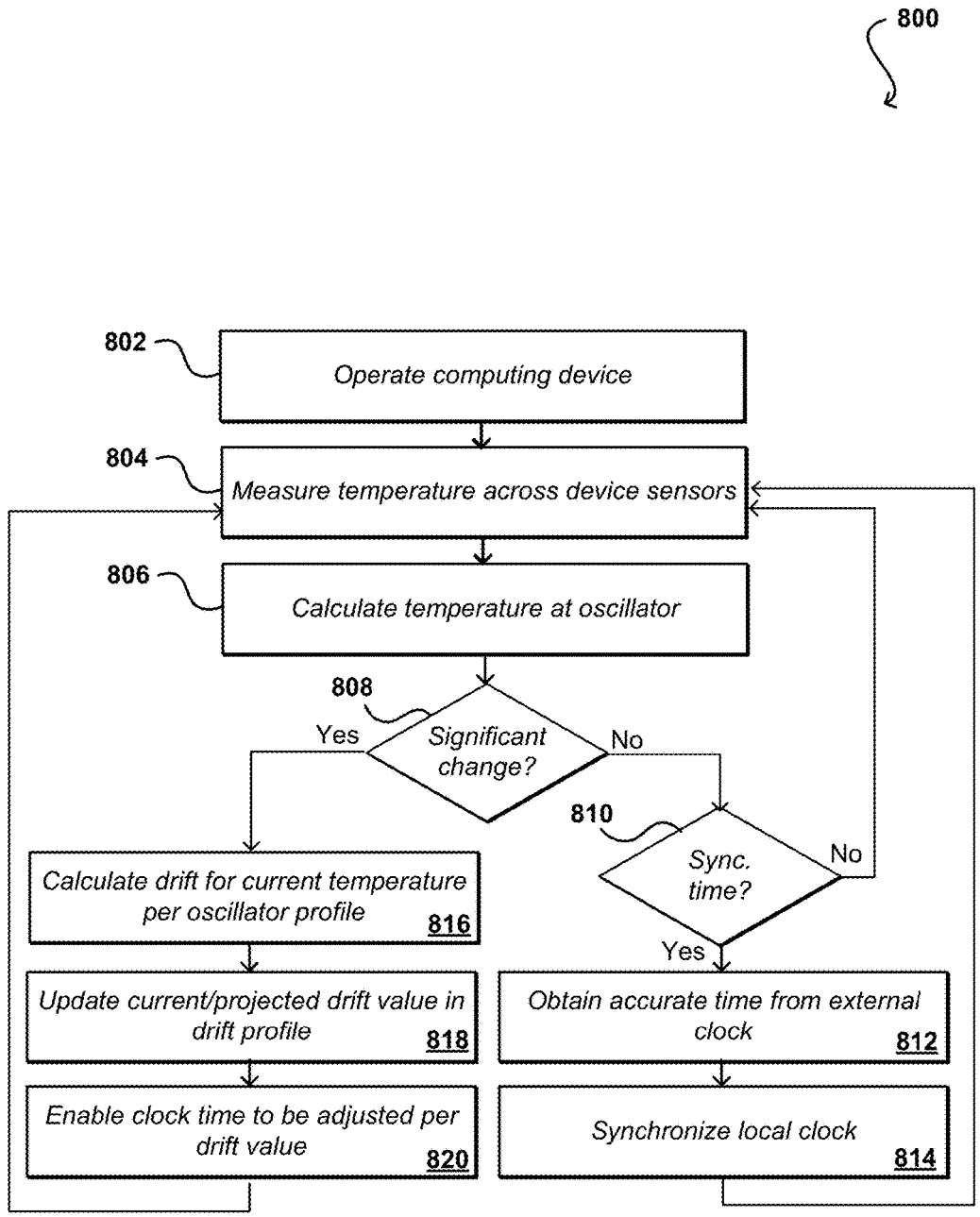
FIG. 8 illustrates an example process for accounting for drift in a local clock that can be utilized in accordance with various embodiments.

FIG. 8 illustrates an example process 800 for adjusting clock values based on oscillator drift calculations that can be utilized in accordance with various embodiments. In this example, a computing device such as a server is operated 802 in a networked environment, such as a data center. In some embodiments, an operating system (OS) on the computing device can be configured to pull an oscillator profile, such as that generated in FIG. 7, from an appropriate accessible location and store that profile in a location on the computing device that is accessible to the NTP daemon, or other component or process, for disciplining a local clock. During operation, the temperature can be measured 804 across a set of device sensors, although a single temperature sensor can be used in at least some embodiments. The temperature data can be used to calculate 806 or otherwise determine the current temperature at the oscillator used for the system clock, or any other clock source on the computing device. As mentioned, the calculation could involve looking at the closest temperature value, an average value across the temperature sensors, a weighted value of the sensors, or a temperature value determined from a heat map or model for the computing device, among other such options. A determination can be made 808 as to whether a significant change has occurred since the last measurement or adjustment. This can be used to reduce the amount of resources needed to adjust the clock when the drift is below a detectable or specified amount such that the accuracy of the clock is within allowed levels of variation. If the change is insignificant, then the computing device can be allowed to continue its operation under the current clock synchronization values.

If a change in temperature is detected that is significant, or may result in a significant change in drift of the oscillator, then a drift calculation procedure can be initiated. In this example, a current drift rate for the oscillator can be calculated 816 using an oscillator profile such as was generated in the process of FIG. 7. The temperature at the oscillator can be determined and a lookup or calculation performed to determine the current amount of drift of the oscillator for that temperature. Various other approaches can be used as well as discussed elsewhere herein. The current and/or projected drift value can be updated 818 in the drift profile for the oscillator or clock in order to reflect the current amount of drift. The clock time is then enabled 820 to be adjusted based at least in part upon the current drift value, such as by the NTP daemon or similar such component updating the synchronization data for the clock. This process can continue for each significant change in temperature or response. As mentioned, an advantage of steps 816-820 is that these steps are part of a purely local operation, which enables a device to update the clock time at very small intervals with very little additional overhead. At some points a determination can be made 810 as to whether a synchronization time has been reached with respect to an external clock. As mentioned, the timing can be configurable to any reasonable time, such as every five, ten, or fifteen minutes, among other such options. When a synchronization time has been reached, an accurate time value can be obtained 812 from a reliable external clock, such as an atomic clock, and that value can be used to synchronize the local clock using a conventional approach for synchronization as known for such purposes. As mentioned there may be many instances or resources synchronizing to this accurate clock, such that the period for synchronization using the clock can be relatively long in order to prevent overwhelming the clock authority. The amount of adjustment for a synchronization action can also be monitored to determine instances where an oscillator might need to be re-profiled, as the values are drifting more than desired, or replaced, such as where the response of the oscillator has become erratic or chaotic, etc.

Although discussed primarily with respect to temperature, there can be other factors that impact oscillator response as well in various implementations. For example, variations in voltage may impact the oscillator response, as well as factors such as humidity or vibration. For any or all of these factors, sensors can be used to determine the current value(s) which can be used to determine the current drift of the oscillator. These factors can be modeled as discussed for temperature, and a corresponding oscillator profile generated. In some embodiments a profile can be generated that is a function of two or more of these factors. The number and/or selection of factors used can depend at least in part upon the sensors available and the desired level of accuracy, among other such factors.

Aspects of timing improvement can also be applied at a virtualization layer. A virtualization layer operating via the Zen virtualization platform can expose a paravirtual clock that can be linked to a physical clock. The mapping generated for the physical clock can be used to adjust the paravirtual clock as well. Since aspects such as location in a server rack or data center may also affect variability and response, the decision as to where to place certain virtual instances can be based at least in part upon the location, variability, and response. For certain instances where precise timing is required, those instances can be placed on machines in locations associated with lower variability, as well as on machines with oscillators that show less and/or more uniform variation, among other such options. Such approaches could be used for any applications or services provided by a set of resources, in order to provide more accurate timing and synchronization where desired without significant additional cost.

Further, the functionality discussed herein is described as primarily being located on a computing device or a configuration manager, but such functionality could also be offered as a service to third parties or other such entities. For example, a synchronization service could perform oscillator profiling if access to a device is provided, or can model data provided for a device. The service can then periodically obtain temperature readings from the device, determine the relative oscillator drift, and provide that drift value to the appropriate component or process managing timing for the device. In some embodiments the service might perform only the mapping, profiling, or real-time determinations, among other such options.

Figure 9:
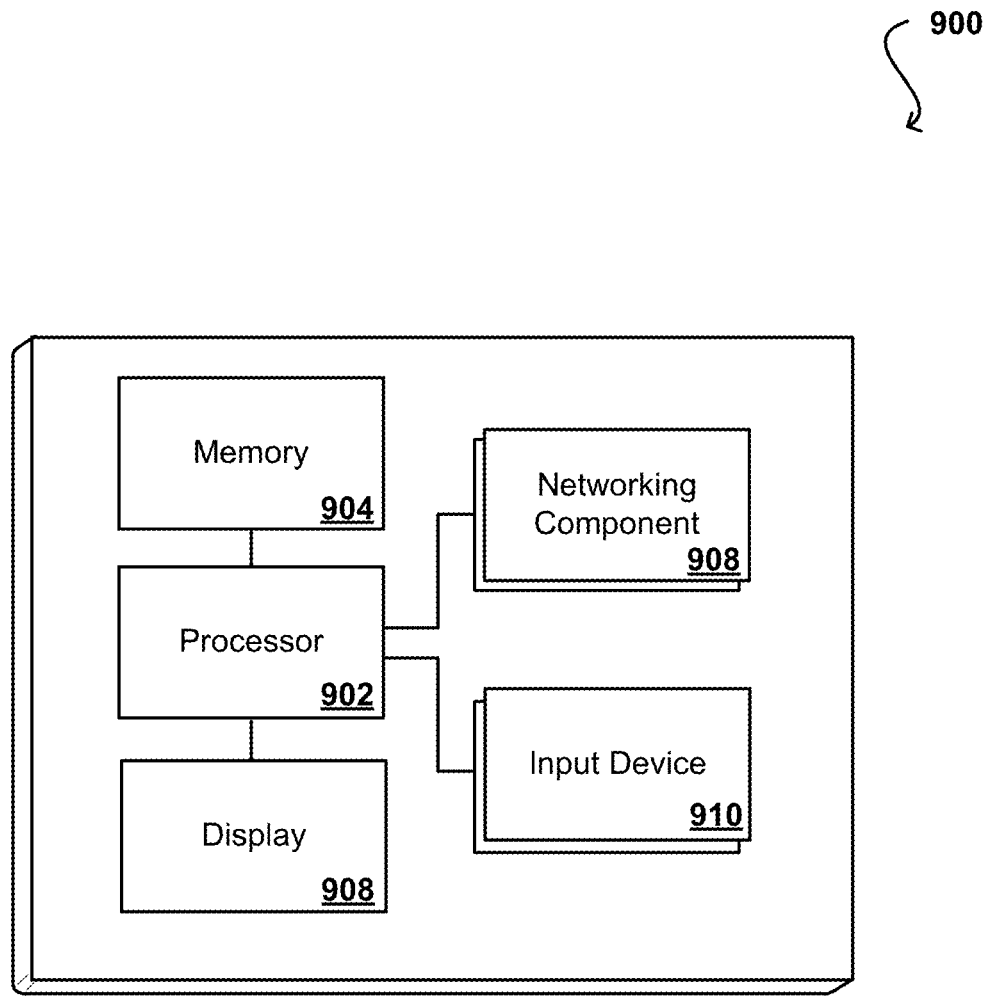
FIG. 9 illustrates example components of a computing device that can be used to implement aspects of various embodiments.

FIG. 9 illustrates a set of basic components of an example computing device 900 that can be utilized to implement aspects of the various embodiments. In this example, the device includes at least one processor 902 for executing instructions that can be stored in a memory device or element 904. As would be apparent to one of ordinary skill in the art, the device can include many types of memory, data storage or computer-readable media, such as a first data storage for program instructions for execution by the at least one processor 902, the same or separate storage can be used for images or data, a removable memory can be available for sharing information with other devices, and any number of communication approaches can be available for sharing with other devices. The device may include at least one type of display element 906, such as a touch screen, electronic ink (e-ink), organic light emitting diode (OLED) or liquid crystal display (LCD), although devices such as servers might convey information via other means, such as through a system of lights and data transmissions. The device typically will include one or more networking components 908, such as a port, network interface card, or wireless transceiver that enables communication over at least one network. The device can include at least one input device 910 able to receive conventional input from a user. This conventional input can include, for example, a push button, touch pad, touch screen, wheel, joystick, keyboard, mouse, trackball, keypad or any other such device or element whereby a user can input a command to the device. These I/O devices could even be connected by a wireless infrared or Bluetooth or other link as well in some embodiments. In some embodiments, however, such a device might not include any buttons at all and might be controlled only through a combination of visual and audio commands such that a user can control the device without having to be in contact with the device.

As discussed, different approaches can be implemented in various environments in accordance with the described embodiments. As will be appreciated, although a Web-based environment is used for purposes of explanation in several examples presented herein, different environments may be used, as appropriate, to implement various embodiments. The system includes an electronic client device, which can include any appropriate device operable to send and receive requests, messages or information over an appropriate network and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled via wired or wireless connections and combinations thereof. In this example, the network includes the Internet, as the environment includes a Web server for receiving requests and serving content in response thereto, although for other networks, an alternative device serving a similar purpose could be used, as would be apparent to one of ordinary skill in the art.

The illustrative environment includes at least one application server and a data store. It should be understood that there can be several application servers, layers or other elements, processes or components, which may be chained or otherwise configured, which can interact to perform tasks such as obtaining data from an appropriate data store. As used herein, the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device and handling a majority of the data access and business logic for an application. The application server provides access control services in cooperation with the data store and is able to generate content such as text, graphics, audio and/or video to be transferred to the user, which may be served to the user by the Web server in the form of HTML, XML or another appropriate structured language in this example. The handling of all requests and responses, as well as the delivery of content between the client device and the application server, can be handled by the Web server. It should be understood that the Web and application servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store illustrated includes mechanisms for storing content (e.g., production data) and user information, which can be used to serve content for the production side. The data store is also shown to include a mechanism for storing log or session data. It should be understood that there can be many other aspects that may need to be stored in the data store, such as page image information and access rights information, which can be stored in any of the above listed mechanisms as appropriate or in additional mechanisms in the data store. The data store is operable, through logic associated therewith, to receive instructions from the application server and obtain, update or otherwise process data in response thereto. In one example, a user might submit a search request for a certain type of item. In this case, the data store might access the user information to verify the identity of the user and can access the catalog detail information to obtain information about items of that type. The information can then be returned to the user, such as in a results listing on a Web page that the user is able to view via a browser on the user device. Information for a particular item of interest can be viewed in a dedicated page or window of the browser.

Each server typically will include an operating system that provides executable program instructions for the general administration and operation of that server and typically will include computer-readable medium storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated. Thus, the depiction of the systems herein should be taken as being illustrative in nature and not limiting to the scope of the disclosure.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:

initiating an oscillator profiling procedure on a computing device, the computing device including a plurality of heat-modifying components and a plurality of temperature sensors, the computing device further including an oscillator providing a timing signal for a system clock, the oscillator profiling procedure causing load to be applied to at least a subset of the heat-modifying components in order to increase a temperature of the computing device over a period of time, the heat-modifying components including at least one of a heat-generating component or a heat-reducing component;

measuring a response of the oscillator, at each of a plurality of temperatures measured by the temperature sensors, against a trusted external clock during the oscillator profiling procedure;

generating an oscillator profile indicating an amount of drift in the oscillator timing signal as a function of temperature;

operating the computing device, after completion of the oscillator profiling procedure, on behalf of a customer;

synchronizing the system clock using timing data from the trusted external clock;

measuring temperature data using the plurality of temperature sensors;

calculating an oscillator temperature based at least in part upon the temperature data;

determining, based at least in part upon the oscillator temperature and the oscillator profile, a current amount of drift in the oscillator timing signal;

adjusting the system clock to compensate for the current amount of drift;

applying the oscillator profile to a paravirtual clock associated with a virtualization layer;

adjusting the paravirtual clock, based at least in part on the oscillator profile;

determining the current amount of drift exceeds a predetermined amount;

re-profiling the oscillator in response to determining the current drift exceeds the predetermined amount;

determining a second current drift amount exceeds the predetermined amount;

relocating data of the computing device to a second computing device; and determining, in response to determining the second current drift amount exceeds the predetermined amount, to perform at least one of a repair or a replacement of the computing device.

2. The computer-implemented method of claim 1, further comprising:

synchronizing the system clock using the timing data from the trusted external clock at a regular interval, wherein the adjusting of the system clock to compensate for the current amount of drift occurs at a smaller interval within the regular interval in order to provide for improved synchronization between synchronizing at the regular interval using the trusted external clock.

3. The computer-implemented method of claim 2, further comprising:

determining that a change event has occurred, the change event corresponding to a physical change to the computing device or a difference between the timing data from the trusted external clock and timing data from the system clock exceeding a maximum difference threshold after compensating for the current amount of drift; and triggering a re-profiling of the oscillator.

4. The computer-implemented method of claim 1, further comprising:

determining that the oscillator temperature differs from a prior oscillator temperature by more than a minimum temperature change threshold before determining the current amount of drift.

5. The computer-implemented method of claim 1, further comprising:

modeling temperature variation across the computing device using the temperature data measured by the plurality of temperature sensors; and calculating the oscillator temperature data using the modeled temperature variation and the temperature data measured using the plurality of temperature sensors.

6. A computer-implemented method, comprising:

measuring operational state in an electronic device using at least one device sensor;

determining, based at least in part upon the operational state and an oscillator profile, a current amount of variation in a timing signal provided by an oscillator of the electronic device, the oscillator profile indicating variations in the timing signal for a range of operating states;

adjusting a virtual time of a paravirtual clock associated with a virtualization layer based at least in part on the oscillator profile; and determining the current amount of variation exceeds a predetermined amount;

re-profiling the oscillator in response to determining the current amount of variation exceeds the predetermined amount;

determining a second current drift amount exceeds the predetermined amount;

relocating data of the electronic device to a second electronic device; and determining, in response to determining the second current drift amount exceeds the predetermined amount, to perform at least one of a repair or a replacement of the electronic device.

7. The computer-implemented method of claim 6, further comprising:

adjusting a current time of the system clock of the electronic device based at least in part upon the current amount of variation, wherein the system clock updates time values based at least in part upon the timing signal provided by the oscillator; and synchronizing the system clock with a reliable external clock, wherein the synchronizing of the system clock with the reliable external clock occurs at a regular interval, and wherein the adjusting of the current time of the system clock occurs during the regular interval.

8. The computer-implemented method of claim 7, further comprising:

determining that a difference between the timing data from the reliable external clock and the system clock exceeds a maximum difference threshold even after compensating for the current amount of variation in the timing signal; and triggering a re-profiling of the oscillator.

9. The computer-implemented method of claim 6, wherein the operational state includes at least one of a temperature, an applied voltage, an applied, current, an amount of humidity, or an amount of vibration.

10. The computer-implemented method of claim 6, further comprising:

initiating an oscillator profiling procedure on the electronic device, the electronic device including a plurality of heat-modifying components and a plurality of temperature sensors, the oscillator profiling procedure causing load to be applied to at least a subset of the heat-modifying components in order to increase a temperature of the computing device, the heat-modifying components including at least one of a heat-generating component or a heat-reducing component;

measuring a response of the oscillator at each of a plurality of temperatures measured by the plurality of temperature sensors during the oscillator profiling procedure; and generating the oscillator profile indicating an amount of drift in the oscillator timing signal as a function of temperature.

11. The computer-implemented method of claim 10, further comprising:

applying a first amount of load to a first component of the plurality of heat-modifying components in order to increase the device temperature to a first temperature value; and subsequently applying at least a second amount of load to at least a second component of the plurality of heat-modifying components in order to increase the device temperature to a second temperature value greater than the first temperature value.

12. The computer-implemented method of claim 11, further comprising:
generating a heat map model for the electronic device based at least in part upon temperature values measured by the plurality of device sensors while applying at least the first amount and the second amount of load.

13. The computer-implemented method of claim 12, further comprising:
calculating a current temperature using temperature data from the at least one temperature sensor, the current temperature corresponding to a location of the oscillator in the electronic device, wherein the current temperature is calculated based at least in part upon an average temperature value of the temperature data, a weighted combination of the temperature data, or the heat map model of the electronic device using the temperature data.

14. The computer-implemented method of claim 6, further comprising:
determining that a current temperature differs from a prior oscillator temperature by more than a minimum temperature change threshold before determining the current amount of variation in the timing signal provided by the oscillator.

15. The computer-implemented method of claim 6, further comprising:
determining a rate of change of the operational state in the electronic device;
determining, based at least in part upon the rate of change, a projected amount of variation in the timing signal over a future period of time; and
adjusting the current time of the system clock based at least in part upon the projected amount of variation.

16. The computer-implemented method of claim 6, further comprising:
storing information for the operational state and the current amount of variation to a remote location for analysis, the analysis capable of generating one or more recommendations relating to an operation, selection, or configuration of the computing device.

17. A computing device, comprising:
at least one processor;
a plurality of temperature sensors;
a device oscillator;
a system clock obtaining a timing signal from the device oscillator; and
memory including instructions that, when executed by the system, cause the system to:
measure current temperature in an electronic device using the plurality of temperature sensors;
determine, based at least in part upon the current temperature and an oscillator profile for the device oscillator, a current amount of variation in the timing signal provided by the device oscillator, the oscillator profile indicating variations in the timing signal for a range of operating temperatures;
adjust a virtual time of a paravirtual clock associated with a virtualization layer based at least in part on the oscillator profile; and
determine the current amount of variation exceeds a predetermined amount;
re-profile the oscillator in response to determining the current amount of variation exceeds the predetermined amount;
determine a second current drift amount exceeds the predetermined amount;
relocate data of the electronic device to a second electronic device; and
determine, in response to determining the second current drift amount exceeds the predetermined amount, to perform at least one of a repair or a replacement of the electronic device.

18. The computing device of claim 17, wherein the instructions when executed further cause the system to:
adjust a current time of the system clock based at least in part upon the current amount of variation, wherein the system clock updates time values based at least in part upon the timing signal provided by the oscillator; and
synchronize the system clock with a reliable external clock, wherein the synchronizing of the system clock with the reliable external clock occurs at a regular interval, and wherein the adjusting of the current time of the system clock occurs during the regular interval.

19. The computing device of claim 17, wherein the instructions when executed further cause the system to:
initiate an oscillator profiling procedure on the electronic device, the electronic device including a plurality of heat-generating components and a plurality of temperature sensors, the oscillator profiling procedure causing load to be applied to at least a subset of the heat-generating components in order to increase a temperature of the computing device;
measure a response of the oscillator at each of a plurality of temperatures measured by the plurality of temperature sensors during the oscillator profiling procedure; and
generate the oscillator profile indicating an amount of drift in the oscillator timing signal as a function of temperature.

20. The computing device of claim 17, wherein the instructions when executed further cause the system to:
calculate the current temperature using temperature data from the at least one temperature sensor, the current temperature corresponding to a location of the oscillator in the electronic device, wherein the current temperature is calculated based at least in part upon an average temperature value of the temperature data, a weighted combination of the temperature data, or a heat map model of the electronic device using the temperature data.

* * * * *